United States Patent
Dogiamis et al.

(10) Patent No.: US 11,387,200 B2
(45) Date of Patent: Jul. 12, 2022

(54) MICROELECTRONIC DEVICES WITH HIGH FREQUENCY COMMUNICATION MODULES HAVING COMPOUND SEMICONDUCTOR DEVICES INTEGRATED ON A PACKAGE FABRIC

(71) Applicant: Intel Corporation, Santa Clara, CA (US)

(72) Inventors: Georgios C. Dogiamis, Chandler, AZ (US); Telesphor Kamgaing, Chandler, AZ (US); Javier A. Falcon, Chandler, AZ (US); Yoshihiro Tomita, Ibaraki (JP); Vijay K. Nair, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 137 days.

(21) Appl. No.: 16/827,296

(22) Filed: Mar. 23, 2020

(65) Prior Publication Data
US 2020/0227366 A1 Jul. 16, 2020

Related U.S. Application Data

(62) Division of application No. 15/771,982, filed as application No. PCT/US2015/067539 on Dec. 22, 2015, now Pat. No. 10,629,551.

(51) Int. Cl.
*H01L 23/66* (2006.01)
*H01L 23/00* (2006.01)
(Continued)

(52) U.S. Cl.
CPC .............. *H01L 23/66* (2013.01); *H01L 24/16* (2013.01); *H01L 25/18* (2013.01); *H01L 24/13* (2013.01);
(Continued)

(58) Field of Classification Search
CPC ......... H01L 23/66; H01L 24/16; H01L 24/13; H01L 24/20; H01L 25/18; H01L 25/0652;
(Continued)

(56) References Cited

U.S. PATENT DOCUMENTS 8,217,272 B2   7/2012   Choudhury et al.
8,917,210 B2   12/2014  Dang
(Continued)

FOREIGN PATENT DOCUMENTS

CN   102157396   8/2011
CN   104078451   10/2014
(Continued)

OTHER PUBLICATIONS

Notice of Allowance from Taiwan Patent Application No. 105137623, dated Nov. 30, 2020, 3 pgs.
(Continued)

*Primary Examiner* — Peniel M Gumedzoe
(74) *Attorney, Agent, or Firm* — Schwabe, Williamson & Wyatt, P.C.

(57) ABSTRACT

Embodiments of the invention include a microelectronic device that includes a first die formed with a silicon based substrate and a second die coupled to the first die. The second die is formed with compound semiconductor materials in a different substrate (e.g., compound semiconductor substrate, group III-V substrate). An antenna unit is coupled to the second die. The antenna unit transmits and receives communications at a frequency of approximately 4 GHz or higher.

20 Claims, 3 Drawing Sheets

(51) Int. Cl.
*H01L 25/18* (2006.01)
*H01L 25/065* (2006.01)

(52) U.S. Cl.
CPC .......... *H01L 24/20* (2013.01); *H01L 25/0652* (2013.01); *H01L 25/0657* (2013.01); *H01L 2223/6672* (2013.01); *H01L 2223/6677* (2013.01); *H01L 2224/12105* (2013.01); *H01L 2224/13025* (2013.01); *H01L 2224/16225* (2013.01); *H01L 2224/16235* (2013.01); *H01L 2225/06517* (2013.01); *H01L 2225/06541* (2013.01); *H01L 2225/06572* (2013.01); *H01L 2924/1032* (2013.01); *H01L 2924/1033* (2013.01); *H01L 2924/10253* (2013.01); *H01L 2924/10329* (2013.01); *H01L 2924/15192* (2013.01); *H01L 2924/15311* (2013.01); *H01L 2924/19011* (2013.01); *H01L 2924/19105* (2013.01)

(58) Field of Classification Search
CPC ......... H01L 25/0657; H01L 2223/6672; H01L 2223/6677; H01L 2224/16235; H01L 2924/10253; H01L 2924/1033; H01L 2924/19011; H01L 2924/19105
See application file for complete search history.

(56) References Cited

U.S. PATENT DOCUMENTS

| | | | |
|---|---|---|---|
| 10,122,089 | B2 | 11/2018 | Nair et al. |
| 10,319,688 | B2 | 6/2019 | Wolter et al. |
| 2009/0322643 | A1 | 12/2009 | Choudhry |
| 2011/0147920 | A1 | 6/2011 | Choudhury et al. |
| 2012/0175779 | A1 | 7/2012 | Lin |
| 2012/0280366 | A1 | 11/2012 | Kamgaing et al. |
| 2013/0009320 | A1 | 1/2013 | Yoo et al. |
| 2014/0002187 | A1 | 1/2014 | McPartlin |
| 2014/0158774 | A1* | 6/2014 | Tsutsumi ............ H01Q 1/2283 235/492 |
| 2014/0293529 | A1* | 10/2014 | Nair .................... H01Q 23/00 361/679.31 |
| 2015/0084194 | A1 | 3/2015 | Molzer et al. |

FOREIGN PATENT DOCUMENTS

| | | |
|---|---|---|
| CN | 104701304 | 6/2015 |
| WO | WO-03-030254 A2 | 4/2003 |

OTHER PUBLICATIONS

Office Action from Taiwan Patent Application No. 105137623, dated Apr. 24, 2020, 9 pgs.
Office Action for Chinese Patent Application No. 201580084743.4, dated Jun. 30, 2021, 22 pgs., with English translation.
International Search Report and Written Opinion for International Patent Application No. PCT/US2015/067539 dated Sep. 21, 2016, 14 pgs.
International Preliminary Report on Patentability for International Patent Application No. PCT/US2015/067539, dated Jul. 5, 2018, 11 pages.
Office Action for Chinese Patent Application No. 201580084743.4, dated Jan. 26, 2022, 21 pgs.

* cited by examiner

MICROELECTRONIC DEVICES WITH HIGH FREQUENCY COMMUNICATION MODULES HAVING COMPOUND SEMICONDUCTOR DEVICES INTEGRATED ON A PACKAGE FABRIC

CROSS-REFERENCE TO RELATED APPLICATION

This patent application is a divisional of U.S. patent application Ser. No. 15/771,982, filed Apr. 27, 2018, which is a U.S. National Phase Application under 35 U.S.C. § 371 of International Application No. PCT/US2015/067539, filed Dec. 22, 2015, entitled "MICROELECTRONIC DEVICES WITH HIGH FREQUENCY COMMUNICATION MODULES HAVING COMPOUND SEMICONDUCTOR DEVICES INTEGRATED ON A PACKAGE FABRIC," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices with high frequency communication modules having compound semiconductor devices integrated on a package fabric.

BACKGROUND OF THE INVENTION

Future wireless products are targeting operation frequencies much higher than the lower GHz range utilized presently. For instance 5G ($5^{th}$ generation mobile networks or $5^{th}$ generation wireless systems) communications is expected to operate at a frequency greater than or equal to 15 GHz. Moreover, the current WiGig (Wireless Gigabit Alliance) products operate around 60 GHz. Other applications including automotive radar and medical imaging, utilize wireless communication technologies in the millimeter wave frequencies (e.g. 30 GHz-300 GHz). For these wireless applications, the designed RF (radio frequency) circuits are in need of high quality passive matching networks, in order to accommodate the transmission of pre-defined frequency bands (where the communication takes place) as well as in need of high efficiency power amplifiers and low loss power combiners/switches.

DETAILED DESCRIPTION OF THE INVENTION

Described herein are microelectronic devices with high frequency communication modules having compound semiconductor devices integrated on a package fabric. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation. For high frequency (e.g., 5G, WiGig) wireless applications, the designed RF circuits (e.g., low-noise amplifiers, mixers, power amplifiers, etc.) are in need of high quality passive matching networks, in order to accommodate the transmission of pre-defined frequency bands where the communication takes place as well as in need of high efficiency power amplifiers and low loss power combiners/switches, etc. CMOS technology for greater than 30 GHz operation can be utilized, but with decreased power amplifier efficiencies and with low quality passives, mainly due to the typically lossy silicon substrate employed. This results not only in a lower system performance, but also in increased thermal requirements due to the excess heat generated. In one example, the high thermal dissipation is due to the fact that multiple power amplifiers have to be utilized in a phased array arrangement to achieve the desired output power and transmission range. This will be even more stringent on 5G systems as the typical transmission range for cellular network (e.g., 4G, LTE, LTE-Adv) is several times larger than that required for connectivity (e.g., WiFi, WiGig).

The present design utilizes non-CMOS technologies (e.g., GaAs, GaN, Passives-on-Glass, etc.) for the critical parts of the communication system. With an optimal system partitioning, critical parts requiring high efficiencies and high quality factors can be fabricated on another technology. These parts might be either on device level (e.g., transistors on GaN/GaAs) or on circuit level (e.g., III-V die integrating a power amplifier, a low noise amplifier). The full communication system will be formed in a package-fabric manner, as discussed in embodiments of this invention.

The present design technology allows co-integrating dies and/or devices that are fabricated on different technologies and/or substrates on the same package for performance enhancement and relaxation of thermal requirements. The present design includes packages that may include antenna for communication with other wireless systems. Previous and current generations of mobile and wireless communication (e.g., 2G, 3G, 4G) do not have the antenna co-integrated on the package because this was not area efficient.

In one embodiment, the present design is a 5G (5th generation mobile networks or 5th generation wireless systems) architecture having non-CMOS based transceiver building blocks (such as group III-V based devices or dies) are co-integrated on the same package with low frequency circuits and IPDs for performance enhancement and thermal requirements relaxation. In this arrangement, each component is assembled directly in the package. The package may have antennas directly integrated onto it. The 5G architecture operates at a high frequency (e.g., at least 20 GHz, at least 28 GHz, at least 30 GHz, etc.) and may also have approximately 1-10 gigabits per second (Gbps) connections to end points. In another example, the present design operates at lower frequencies (e.g., at least 4 GHz, approximately 4 GHz).

In one embodiment, the design of this 5G architecture results in reduced cost due to the functional testing of transceiver components, which utilize the in-mold-circuits, being decoupled from the need to assemble them initially on the package. Additionally, a wireless 5G module, which comprises RFIC with or without on-package antenna, can be designed and sold as a separate module. This design also provides higher quality passives by utilizing integrated passive devices or dies (IPDs). Functional blocks such as impedance matching circuits, harmonic filters, couplers, power combiner/divider, etc. can be implemented with IPDs. IPDs are generally fabricated using wafer fab technologies (e.g., thin film deposition, etch, photolithography processing).

Partitioning the 5G transceiver efficiently allows this architecture to achieve higher power amplifier efficiencies (e.g., using group III-V technologies), improved passives (e.g., utilizing IPDs and more efficient power combiners or switches) due to fabricating the passives on a non-CMOS substrate. The present architecture provides an ability to integrate all of these different discrete components on package together with the antenna to create a full 5G transceiver. These components can either be on a device level (e.g., discrete transistors) or on a circuit level (e.g., a power amplifier, a low noise amplifier).

Figure 1:
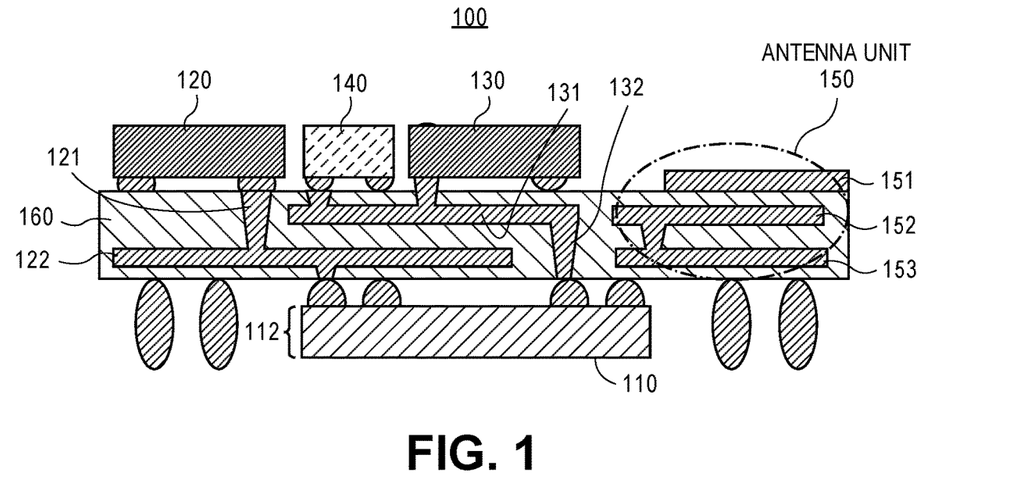
FIG. 1 illustrates co-integrating different components in a microelectronic device (e.g., a package fabric architecture) in accordance with one embodiment.

FIG. 1 illustrates co-integrating different components in a microelectronic device (e.g., a package fabric architecture) in accordance with one embodiment. The microelectronic device 100 (e.g., a package fabric architecture 100) includes complementary metal-oxide-semiconductor (CMOS) circuitry of a die 110 (e.g., CMOS circuitry having at least one baseband unit and at least one transceiver unit formed with a silicon based substrate, CMOS die), circuitry or devices (e.g., individual transistors, groups of transistors) of a die 120 formed with compound semiconductor materials (e.g., group III-V materials, gallium arsenide (GaAs), gallium nitride (GaN), compound semiconductor die, etc.) or organic materials, circuitry or devices (e.g., individual transistors, groups of transistors) of a die 130 formed with compound semiconductor materials (e.g., group III-V materials, gallium arsenide (GaAs), gallium nitride (GaN), compound semiconductor die, etc.) or organic materials, IPD 140, and antenna unit 150 having at least one antenna for transmitting and receiving high frequency communications. Additional components such as traditional surface-mount passives may also be mounted to the package. In addition, the components of FIG. 1 may be overmolded and covered with an external shield. The mold material may be a low loss nonconductive dielectric material and the shielding may be made out of a conductive material. The antenna unit 150 includes conductive layers 151-153. In this example, the via 121 and conductive layer 122 couple the circuitry 120 to the CMOS circuitry 110 for electrical connections between these components. The via 132 and conductive layer 131 couple the IPD 140 and die 130 to the CMOS circuitry of die 110 for electrical connections between these components. The microelectronic device 100 includes a substrate 160 having a plurality of dielectric layers for isolation between conductive layers and components.

In one embodiment, the CMOS die 110 is flip-chipped on one side of the microelectronic device (e.g., a package fabric architecture). In one example, the CMOS die 110 on a first side (e.g., lower surface) of the microelectronic device has a thickness 112 of approximately 10-300 um (e.g., approximately 50 um) while high power, high efficiency group III-V power amplifiers formed in the dies 120 and 130 are located on a second side (e.g., upper surface) of the microelectronic device (e.g., a package fabric architecture). In one example, compound semiconductor materials (e.g., GaN, GaAs) have significantly higher electron mobility in comparison to Silicon materials which allows faster operation. The compound semiconductor materials also have wider band gap, which allows operation of power devices at higher temperatures, and give lower thermal noise to low power devices at room temperature in comparison to Silicon materials. The compound semiconductor materials also have a direct band gap which provides more favorable optoelectronic properties than an indirect band gap of Silicon. Several passives (e.g., decoupling capacitors, inductors) needed for passive matching networks are integrated in the IPD 140, or passive power combiners, filters, or splitters can be assembled on the microelectronic device (e.g., a package fabric architecture). In one example, the antenna unit 150 is located on the microelectronic device (e.g., a package fabric architecture) as close as possible to power amplifiers of the dies 120 and 130. The components may be approximately drawn to scale or may not be necessarily drawn to scale depending on a particular architecture. In one example, for a frequency of approximately 30 GHz, an antenna unit 150 has dimensions of approximately 2.5 mm by 2.5 mm while the circuitry 120 and 130 each have dimensions of approximately 2.0 mm by 2.0 mm.

In another embodiment, any of the devices can be coupled to each other. For example, the IPD 140 can be coupled to at least one of the dies 110, 120 and 130.

Figure 2:
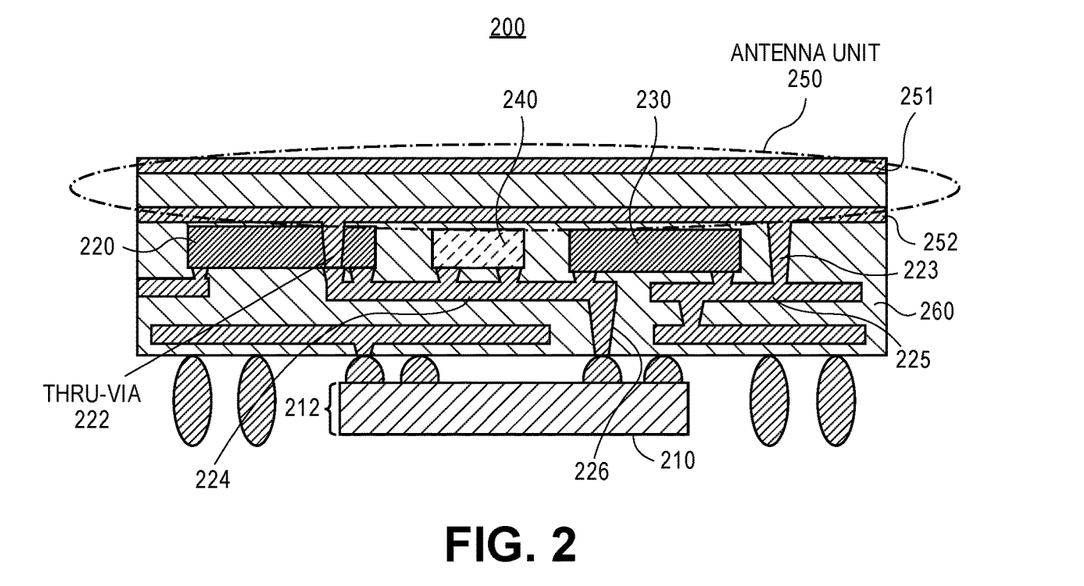
FIG. 2 illustrates co-integrating different components in a microelectronic device (e.g., a package fabric architecture) in accordance with another embodiment.

FIG. 2 illustrates co-integrating different components in a microelectronic device (e.g., a package fabric architecture) in accordance with another embodiment. The microelectronic device 200 (e.g., a package fabric architecture 100) includes CMOS circuitry 210 (e.g., CMOS circuitry having at least one baseband unit and at least one transceiver unit formed with a silicon based substrate, CMOS die), circuitry or devices of a die 220 formed with compound semiconductor materials (e.g., group III-V materials, gallium arsenide (GaAs), gallium nitride (GaN), compound semiconductor die, etc.), circuitry or devices of a die 230 formed with compound semiconductor materials (e.g., group III-V materials, gallium arsenide (GaAs), gallium nitride (GaN), compound semiconductor die, etc.), IPD 240, and antenna unit 250 having at least one antenna for transmitting and receiving high frequency communications (e.g., 5G, WiGig, at least 4 GHz, at least 15 GHz, at least 25 GHz, at least 28 GHz, at least 30 GHz). The antenna unit 250 includes conductive layers 251-253. In this example, the via 226 and conductive layer 224 couple the die 220 and the IPD 240 to the die 210 for electrical connections between these components. The thru-via 222, via 223, and conductive layers 224 and 225 couple the antenna unit 250 to the IPD 240, die 220, die 240, and the die 210 for electrical connections between these components. The microelectronic device 200 includes a plurality of dielectric layers 260 for isolation between conductive layers and components.

FIG. 2 shows another potential development for achieving lower height of the device 200 in a z direction based embedded dies in the device 200. In FIG. 2, the dies 220 and 230 and IPD 240 are embedded in the device 200 and may serve as an interface between the CMOS circuitry 210 (e.g., CMOS die) and the antenna unit 250. Thru-vias might be utilized for the direct vertical connection of the III-V dies (e.g., die 220, circuitry 230) to the antenna unit 250. Matching networks formed from passives or switches can also be eventually integrated in the device 200.

In one embodiment, the CMOS die 210 is flip-chipped on one side of the microelectronic device (e.g., a package fabric architecture). In one example, the die 210 has a thickness 212 of approximately 10-300 um (e.g., approximately 50 um) while high power, high efficiency group III-V power amplifiers formed in the dies 220 and 230 are embedded in the microelectronic device 200 (e.g., a package fabric architecture) as illustrated FIG. 2. In one example, the circuitry or devices of the dies 220 and 230 are embedded within dielectric layers 260 of the device 200. Passives needed for passive matching networks are integrated in the IPD 240, or passive power combiners or splitters can be assembled on the microelectronic device (e.g., a package fabric architecture). The antenna unit 250 is located on the microelectronic device (e.g., a package fabric architecture) as close as possible to power amplifiers of the dies 220 and 230. The components may be approximately drawn to scale or may not be necessarily drawn to scale depending on a particular architecture.

In another embodiment, any of the devices can be coupled to each other. For example, the IPD 140 can be coupled to at least one of the dies 210, 220 and 230.

Figure 3:
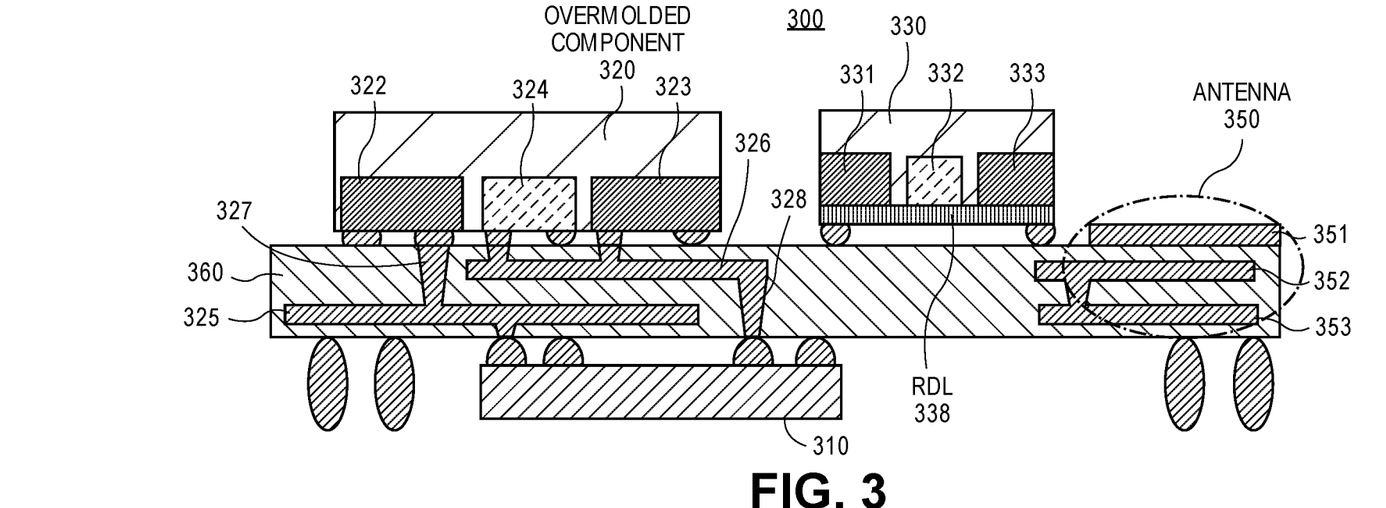
FIG. 3 illustrates co-integrating different components in a microelectronic device (e.g., a package fabric architecture) in accordance with another embodiment.

Another integration technique, is initially molding compound semiconductor devices or dies (e.g., all group III-V devices/dies), discrete SMT components and IPDs together in a separate overmolded component (or module) prior to attaching to a microelectronic device (e.g., communication module). FIG. 3 illustrates co-integrating different components including overmolded component in a microelectronic device (e.g., a package fabric architecture) in accordance with one embodiment. The microelectronic device 300 (e.g., a package fabric architecture 100) includes a CMOS die 310 (e.g., CMOS baseband and transceiver circuitry formed with a silicon based substrate, CMOS die) and overmolded component 320 comprising of dies and/or devices. In one example, a first overmolded component 320 includes circuitry or devices of die 322 formed with compound semiconductor materials (e.g., group III-V materials, gallium arsenide (GaAs), gallium nitride (GaN), compound semiconductor die, etc.) or organic materials, circuitry or devices of die 323 formed with compound semiconductor materials (e.g., group III-V materials, gallium arsenide (GaAs), gallium nitride (GaN), compound semiconductor die, etc.) or organic materials, and IPD 324. The die 322-324 are coupled to each other or other components on a package or substrate 360. A second overmolded component 330 may include circuitry or devices of die 331 formed with compound semiconductor materials (e.g., group III-V materials, gallium arsenide (GaAs), gallium nitride (GaN), compound semiconductor die, etc.) or organic materials, circuitry or devices of die 333 formed with compound semiconductor materials (e.g., group III-V materials, gallium arsenide (GaAs), gallium nitride (GaN), compound semiconductor die, etc.) or organic materials, IPD 332, and a routing or redistribution layer 338 for coupling these dies of the component 330 with other components, circuitry, or dies of the device 300. The die 331-333 are coupled to each other or other components using the routing or redistribution layer 338 and also on a package or substrate 360. An antenna unit 350 having at least one antenna transmits and receives high frequency communications (e.g., 5G, WiGig, at least 4 GHz, at least 15 GHz, at least 25 GHz, at least 28 GHz, at least 30 GHz). The antenna unit 350 includes conductive layers 351-353. In this example, the vias 327 and 328 and conductive layers 325 and 326 couple the dies 322 and 323 and the IPD 324 to the CMOS die 310 for electrical connections between these components. The antenna unit 350 is coupled to the circuitry and dies of the device 300 though the connections are not shown. The microelectronic device 300 includes a substrate 360 having a plurality of dielectric layers for isolation between conductive layers and the components of device 300.

Figure 4:
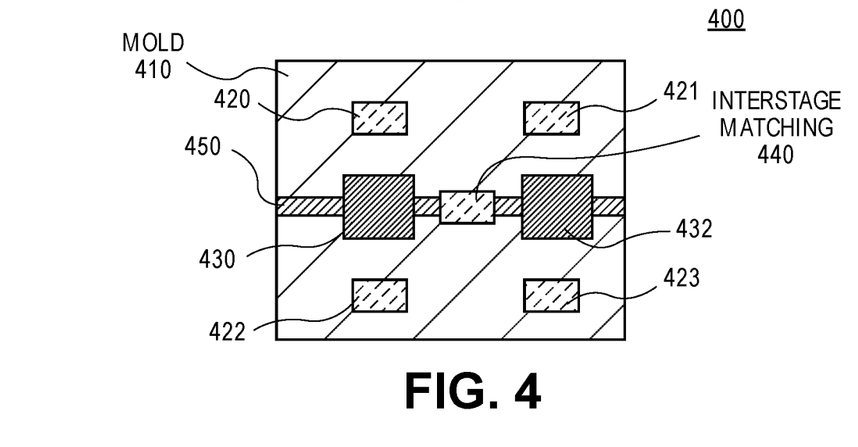
FIG. 4 illustrates a functional circuit in a mold of a package fabric architecture in accordance with one embodiment.

FIG. 3 illustrates an architecture that can combine discrete devices to create a functional circuit in the mold, as shown in FIG. 4 in accordance with one embodiment. Circuitry of an overmolded component can first be tested for functionality and then assembled on a microelectronic device or module if the circuitry is functional. In this manner, the overmolded component achieves a lower cost in case one of the circuitry or devices is failing. An in-mold-circuit of an overmolded component can be implemented using either a routing or redistribution layer on the mold that will carry the routing between the devices or the routing can be designed directly on a microelectronic device (e.g., package). The overmolded component 400 includes circuitry or devices of die 430 formed with compound semiconductor materials (e.g., group III-V materials, gallium arsenide (GaAs), gallium nitride (GaN), compound semiconductor die, etc.) or organic materials, circuitry or devices of die 432 formed with compound semiconductor materials (e.g., group III-V materials, gallium arsenide (GaAs), gallium nitride (GaN), compound semiconductor die, etc.) or organic materials, IPDs 420-423, and interstage matching IPD 440. The component 400 includes one or more conductive layers 450 for coupling the dies and IPDs thru electrical connections. In one example, the interstage matching IPD is coupled to the dies 430 and 432.

In one embodiment, a 5G package-fabric architecture with overmolded dies and CMOS SoCs are assembled on the same double-sided package with an antenna unit. In FIG. 3, overmolded component 320 has been routed over the package, while the component 330 includes a routing layer (RDL). A molded component can be a standalone circuit that includes device level components fabricated on different substrates together with passive networks for matching or decoupling. The routing between the devices can be either be on package or on a routing layer on the mold.

An in-mold circuit reduces cost due to be able to test the in-mold circuit separately from the rest of the substrate before assembly. The present design creates an independent 5G module which can be manufactured and sold separately.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 5:
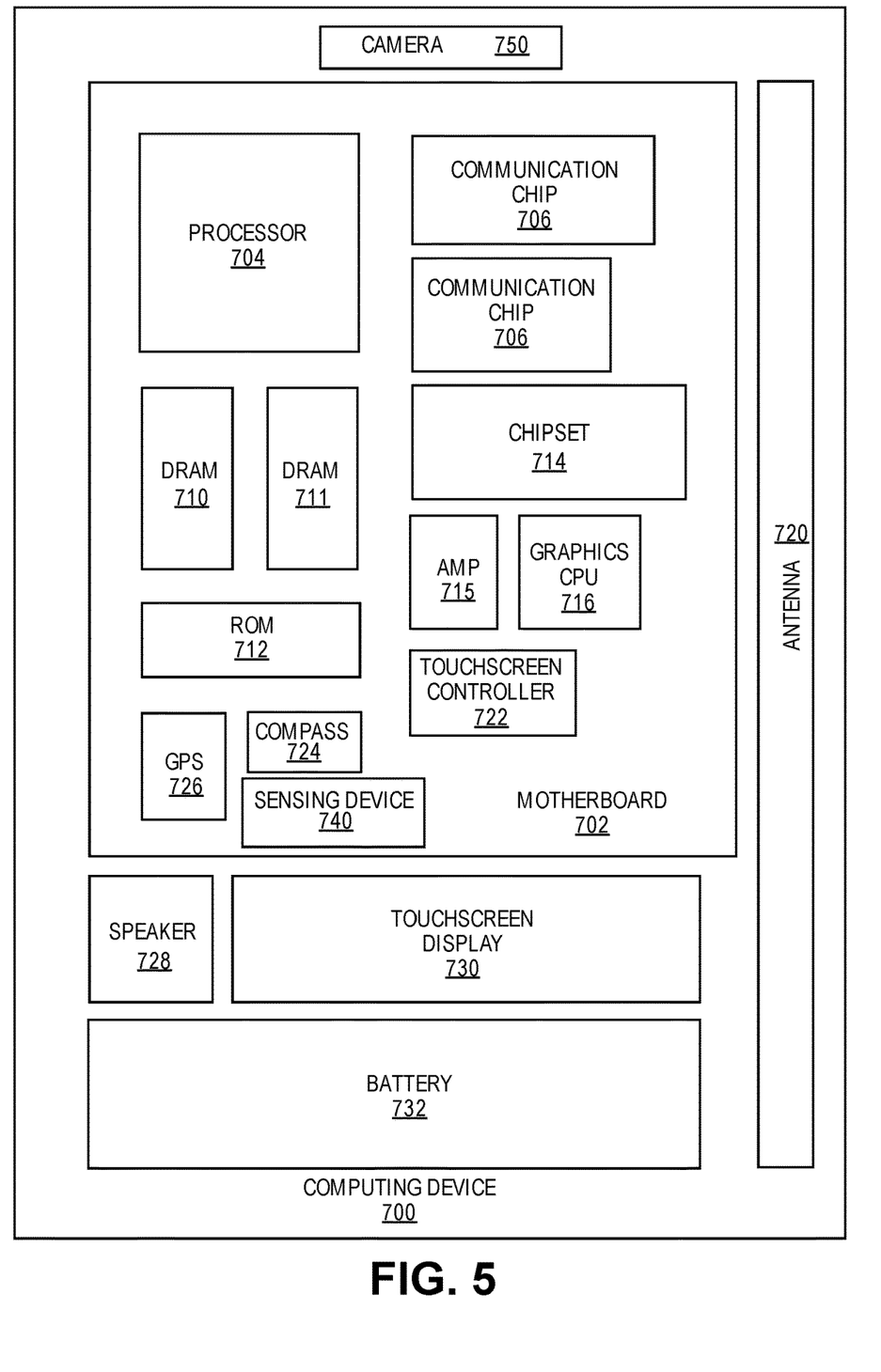
FIG. 5 illustrates a computing device 700 in accordance with one embodiment.

FIG. 5 illustrates a computing device 700 in accordance with one embodiment of the invention. The computing device 700 houses a board 702. The board 702 may include a number of components, including but not limited to at least one processor 704 and at least one communication chip 706. The at least one processor 704 is physically and electrically coupled to the board 702. In some implementations, the at least one communication chip 706 is also physically and electrically coupled to the board 702. In further implementations, the communication chip 706 is part of the processor 704. In one example, the communication chip 706 (e.g., microelectronic device 100, 200, 300, etc.) includes an antenna unit 720 (e.g., antenna unit 150, 250, 350).

Depending on its applications, computing device 700 may include other components that may or may not be physically and electrically coupled to the board 702. These other components include, but are not limited to, volatile memory (e.g., DRAM 710, 711), non-volatile memory (e.g., ROM 712), flash memory, a graphics processor 716, a digital signal processor, a crypto processor, a chipset 714, an antenna unit 720, a display, a touchscreen display 730, a touchscreen controller 722, a battery 732, an audio codec, a video codec, a power amplifier 715, a global positioning system (GPS) device 726, a compass 724, a sensing device 740 (e.g., an accelerometer), a gyroscope, a speaker, a camera 750, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi, WiGig, and Bluetooth and a second communication chip 706 may be dedicated to longer range wireless communications such as GPS, EDGE, GPRS, CDMA, WiMAX, LTE, Ev-DO, 5G, and others.

The at least one processor 704 of the computing device 700 includes an integrated circuit die packaged within the at least one processor 704. In some implementations of the invention, the integrated circuit die of the processor includes one or more devices, such as microelectronic devices (e.g., microelectronic device 100, 200, 300, etc.) in accordance with implementations of embodiments of the invention. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of embodiments of the invention, the integrated circuit die of the communication chip includes one or more microelectronic devices (e.g., microelectronic device 100, 200, 300, etc.).

The following examples pertain to further embodiments. Example 1 is a microelectronic device that includes a first die formed with a silicon based substrate, a second die coupled to the first die. The second die is formed with compound semiconductor materials in a different substrate (e.g., compound semiconductor substrate, group III-V substrate). An antenna unit is coupled to the second die. The antenna unit transmits and receives communications at a frequency of approximately 4 GHz or higher (e.g., at least 4 GHz, at least 15 GHz, at least 25 GHz, at least 30 GHz, etc.).

In example 2, the subject matter of example 1 can optionally include an integrated passive die (IPD) coupled to at least one die. The IPD includes passives for passive matching networks.

In example 3, the subject matter of any one of examples 1-2 can optionally include the first die having a complementary metal-oxide-semiconductor (CMOS) baseband unit and transceiver unit. The first die is flip-chipped on a surface of a first side of the microelectronic device.

In example 4, the subject matter of any one of examples 1-3 can optionally include the second die having power amplifiers formed with group III-V materials attached on a surface of a second side of the microelectronic device. The first side of the microelectronic device is opposite the second side of the microelectronic device.

In example 5, the subject matter of any one of Examples 1-4 can optionally include the microelectronic device further having a third die coupled to at least one die. The third die has devices or circuitry formed with compound semiconductor materials in a different substrate (e.g., compound semiconductor substrate, group III-V substrate).

In example 6, the subject matter of any one of Examples 1-5 can optionally include the microelectronic device having a 5G package architecture for 5G communications.

In example 7, a communication module (or chip) comprises a first die formed with a silicon based substrate and a second die coupled to the first circuitry. The second die is formed with compound semiconductor materials in a different substrate that is embedded within the communication module. An antenna unit is coupled to at least one of the first and second dies. The antenna unit transmits and receives communications at a frequency of approximately 15 GHz or higher (e.g., at least 15 GHz, at least 25 GHz, at least 30 GHz, etc.).

In example 8, the subject matter of example 7 can optionally include the communication module having an integrated passive die (IPD) coupled to at least one die. The IPD is embedded within the communication module.

In example 9, the subject matter of any one of examples 7-8 can optionally include the first die having a complementary metal-oxide-semiconductor (CMOS) baseband and transceiver circuitry. The first die is flip-chipped on a first side of the communication module. The second die comprises power amplifiers formed with group III-V materials embedded within the communication module.

In example 10, the subject matter of any one of examples 7-9 can optionally include a third die that is coupled to at least one die. The third die has devices or circuitry formed with compound semiconductor materials. The third die is embedded within the communication module.

In example 11, the subject matter of any one of examples 7-10 can optionally include the communication module that comprises a 5G package architecture for 5G communications.

In example 12, a computing device includes at least one processor to process data and a communication module or chip coupled to the at least one processor. The communication module or chip comprises a first die formed with a silicon based substrate and a first overmolded component having a second die coupled to the first die. The second die has devices or circuitry formed with compound semiconductor materials in a different substrate. The communication module or chip also includes an antenna unit coupled to the second die. The antenna unit transmits and receives communications at a frequency of approximately 15 GHz or higher (e.g., at least 15 GHz, at least 25 GHz, at least 30 GHz, etc.).

In example 13, the subject matter of example 12 can optionally include the first overmolded component having an integrated passive die (IPD) coupled to at least one die. The IPD includes passives for passive matching networks.

In example 14, the subject matter of any of examples 12-13 can optionally include the first die having a complementary metal-oxide-semiconductor (CMOS) baseband and transceiver circuitry. The first die is flip-chipped on a surface of a first side of the communication module or chip.

In example 15, the subject matter of any of examples 12-14 can optionally include the second die having power amplifiers formed with group III-V materials.

In example 16, the subject matter of any of examples 12-15 can optionally include the first overmolded component being attached on a surface of a second side of the communication module or chip.

In example 17, the subject matter of any of examples 12-16 can optionally include the first overmolded component having a third die coupled to at least one die. The third die has devices or circuitry formed with compound semiconductor materials.

In example 18, the subject matter of any of examples 12-17 can optionally include the second overmolded component having a fourth die coupled to at least one die. The fourth die has devices or circuitry formed with compound semiconductor materials in a substrate.

In example 19, the subject matter of any of examples 12-18 can optionally include the communication module or chip that is a 5G package architecture for 5G communications.

In example 20, the subject matter of any of examples 12-19 can optionally include the computing device further including a memory, a display module, and an input module. The memory, display module and input module being in operative communication on a chip chipset platform and each other.

What is claimed is:

1. A computing device comprising:
   at least one processor to process data; and
   a communication module or chip coupled to the at least one processor, wherein the communication module or chip comprises:
      a first die comprising silicon;
      a first overmolded component having a second die coupled to the first die, the second die having devices or circuitry formed with compound semiconductor materials in a different substrate, wherein the first die is not entirely within a footprint of the first overmolded component; and
      an antenna unit coupled to the second die.

2. The computing device of claim 1 wherein the first overmolded component further comprises an integrated passive die (IPD) coupled to at least one die, the IPD includes passives for passive matching networks.

3. The computing device of claim 2, wherein the first die comprises a complementary metal-oxide-semiconductor (CMOS) baseband and transceiver circuitry that is flip-chipped on a surface of a first side of the communication module or chip.

4. The computing device of claim 1, wherein the circuitry of the second die comprises at least one of power amplifiers, low noise amplifiers, and switches formed with group III-V materials, wherein the first overmolded component is attached on a surface of a second side of the communication module or chip.

5. The computing device of claim 1, wherein the first overmolded component further comprises a third die coupled to at least one die, the third die having devices formed with compound semiconductor materials.

6. The computing device of claim 1, further comprising:
   a second overmolded component having a fourth die coupled to at least one die, the fourth die having devices or circuitry formed with compound semiconductor materials in a substrate.

7. The computing device of claim 1, wherein the communication module or chip comprises a 5G package architecture for 5G communications.

8. The computing device of claim 1, further comprising:
   a memory; a display module; and an input module.

9. A computing device comprising:
   at least one processor to process data; and
   a communication module or chip coupled to the at least one processor, wherein the communication module or chip comprises:
      a first die comprising silicon, the first die on a surface of a first side of the communication module or chip;
      a plurality of external connections on the surface of the first side of the communication module or chip, wherein the first die is laterally adjacent to the plurality of external connections;
      a first overmolded component having a second die coupled to the first die, the second die having devices or circuitry formed with compound semiconductor materials in a different substrate, wherein the first die is not entirely within a footprint of the first overmolded component; and
      an antenna unit coupled to the second die, the antenna unit for transmitting and receiving communications.

10. The computing device of claim 9, wherein the first overmolded component further comprises an integrated passive die (IPD) coupled to at least one die, the IPD includes passives for passive matching networks.

11. The computing device of claim 9, wherein the first die comprises a complementary metal-oxide-semiconductor (CMOS) baseband and transceiver circuitry that is flip-chipped on the surface of the first side of the communication module or chip.

12. The computing device of claim 9, wherein the circuitry of the second die comprises at least one of power amplifiers, low noise amplifiers, and switches formed with group III-V materials, wherein the first overmolded component is attached on a surface of a second side of the communication module or chip.

13. The computing device of claim 9, wherein the first overmolded component further comprises a third die coupled to at least one die, the third die having devices formed with compound semiconductor materials.

14. The computing device of claim 9, further comprising:
a second overmolded component having a fourth die coupled to at least one die, the fourth die having devices or circuitry formed with compound semiconductor materials in a substrate.

15. A computing device comprising:
at least one processor to process data; and
a communication module or chip coupled to the at least one processor, wherein the communication module or chip comprises:
a first die comprising silicon, the first die on a surface of a first side of the communication module or chip;
a first overmolded component having a second die coupled to the first die, the second die having devices or circuitry formed with compound semiconductor materials in a different substrate, the first overmolded component on a surface of a second side of the communication module or chip, the second side opposite the first side, wherein the first die is not entirely within a footprint of the first overmolded component; and
an antenna unit coupled to the second die, the antenna unit for transmitting and receiving communications.

16. The computing device of claim 15, further comprising:
a plurality of external connections on the surface of the first side of the communication module or chip, wherein the first die is laterally adjacent to the plurality of external connections.

17. The computing device of claim 15, wherein the first overmolded component further comprises an integrated passive die (IPD) coupled to at least one die, the IPD includes passives for passive matching networks.

18. The computing device of claim 15, wherein the first die comprises a complementary metal-oxide-semiconductor (CMOS) baseband and transceiver circuitry that is flip-chipped on the surface of the first side of the communication module or chip.

19. The computing device of claim 15, wherein the circuitry of the second die comprises at least one of power amplifiers, low noise amplifiers, and switches formed with group III-V materials.

20. The computing device of claim 15, wherein the first overmolded component further comprises a third die coupled to at least one die, the third die having devices formed with compound semiconductor materials.

* * * * *